US011913851B2

(12) United States Patent
Sano et al.

(10) Patent No.: US 11,913,851 B2
(45) Date of Patent: Feb. 27, 2024

(54) PRESSURE SENSOR

(71) Applicant: Japan Display Inc., Tokyo (JP)

(72) Inventors: Takumi Sano, Tokyo (JP); Shinichiro Oka, Tokyo (JP)

(73) Assignee: Japan Display Inc., Tokyo (JP)

( * ) Notice: Subject to any disclaimer, the term of this patent is extended or adjusted under 35 U.S.C. 154(b) by 374 days.

(21) Appl. No.: 17/462,519

(22) Filed: Aug. 31, 2021

(65) Prior Publication Data

US 2022/0065722 A1 Mar. 3, 2022

(30) Foreign Application Priority Data

Aug. 31, 2020 (JP) ................................. 2020-145546

(51) Int. Cl.
| | |
|---|---|
| *G01L 9/08* | (2006.01) |
| *G01L 1/16* | (2006.01) |
| *G01L 1/18* | (2006.01) |
| *H10N 30/30* | (2023.01) |
| *H10N 30/857* | (2023.01) |
| *H10N 30/87* | (2023.01) |

(52) U.S. Cl.
CPC .................. *G01L 9/08* (2013.01); *G01L 1/16* (2013.01); *G01L 1/18* (2013.01); *H10N 30/302* (2023.02); *H10N 30/857* (2023.02); *H10N 30/87* (2023.02)

(58) Field of Classification Search
CPC ....... G01L 9/02; G01L 9/0051; G01L 9/0052; G01L 9/08; G01L 1/16; G01L 1/18; H10N 30/302; H10N 30/87; G06F 3/0414; G06F 3/04144; G02F 1/13338
See application file for complete search history.

(56) References Cited

U.S. PATENT DOCUMENTS

| 10,331,216 B1* | 6/2019 | Khoshkava | ............. G06F 3/044 |
| 2015/0194591 A1 | 7/2015 | Fujii | |
| 2016/0291729 A1* | 10/2016 | Schardt | .................. H10N 30/01 |
| 2018/0081466 A1* | 3/2018 | Moon | .................. H10N 30/302 |

FOREIGN PATENT DOCUMENTS

| GB | 2554772 A * | 4/2018 | ........... G06F 3/0412 |
| WO | WO 2014/045914 A1 | 3/2014 | |

* cited by examiner

*Primary Examiner* — Benjamin R Schmitt
(74) *Attorney, Agent, or Firm* — Maier & Maier, PLLC

(57) ABSTRACT

A pressure sensor includes an insulating base material, a switching element disposed on the insulating base material, a piezoelectric layer disposed on the insulating base material and the switching element and an underlying layer located between the piezoelectric layer and the insulating base material, and the modulus of elasticity of the underlying layer is greater than the modulus of elasticity of the piezoelectric layer.

9 Claims, 11 Drawing Sheets

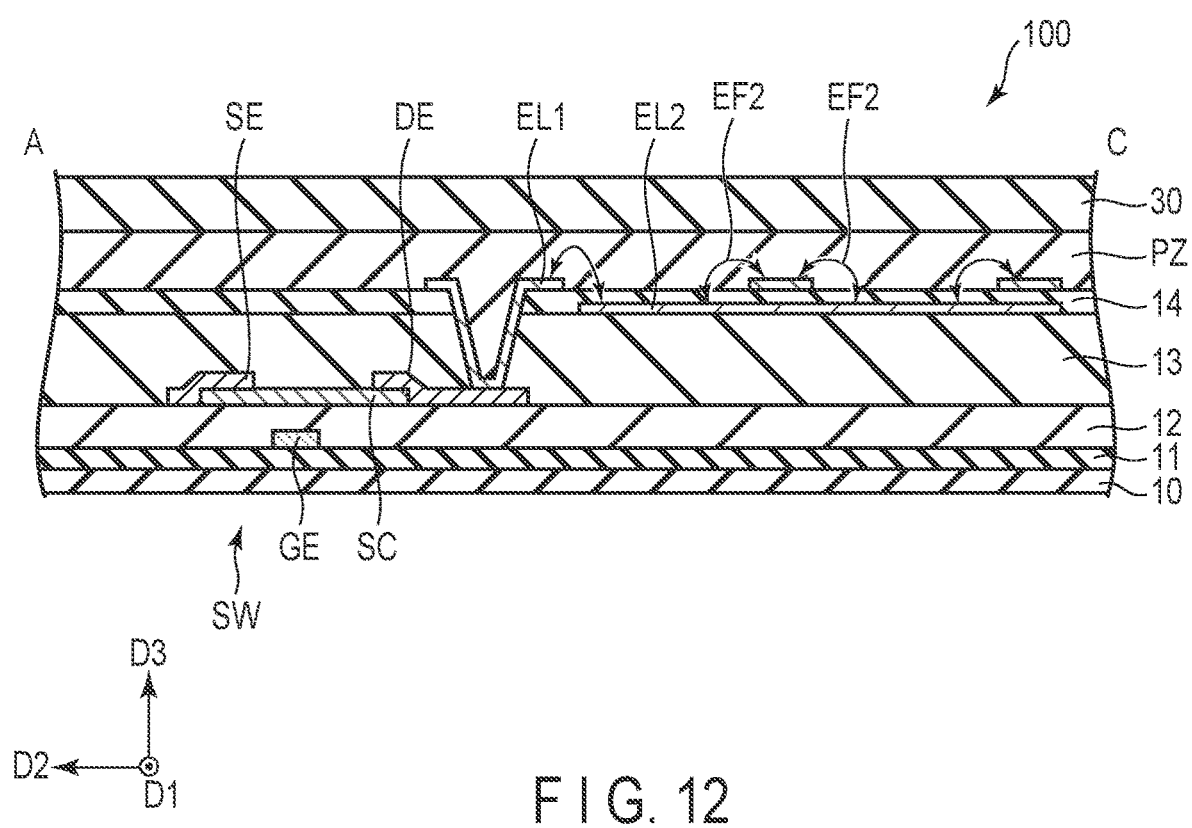
F I G. 12

PRESSURE SENSOR

CROSS-REFERENCE TO RELATED APPLICATIONS

This application is based upon and claims the benefit of priority from Japanese Patent Application No. 2020-145546, filed Aug. 31, 2020, the entire contents of which are incorporated herein by reference.

FIELD

Embodiments described herein relate generally to a pressure sensor.

BACKGROUND

Pressure sensors comprising a piezoelectric layer formed by using a piezoelectric material and a switching element have been studied. The piezoelectric layer is prepared by subjecting a device to polarization treatment in its manufacturing process so as to obtain a required piezoelectric performance. The pressure sensor detects the pressure by reading the voltage generated in the piezoelectric layer when pressure is applied.

BRIEF DESCRIPTION OF THE DRAWINGS

FIG. 12 is a schematic cross-sectional view of a part of the pressure sensor, taken along A-C in FIG. 11.

DETAILED DESCRIPTION

Figure 1:
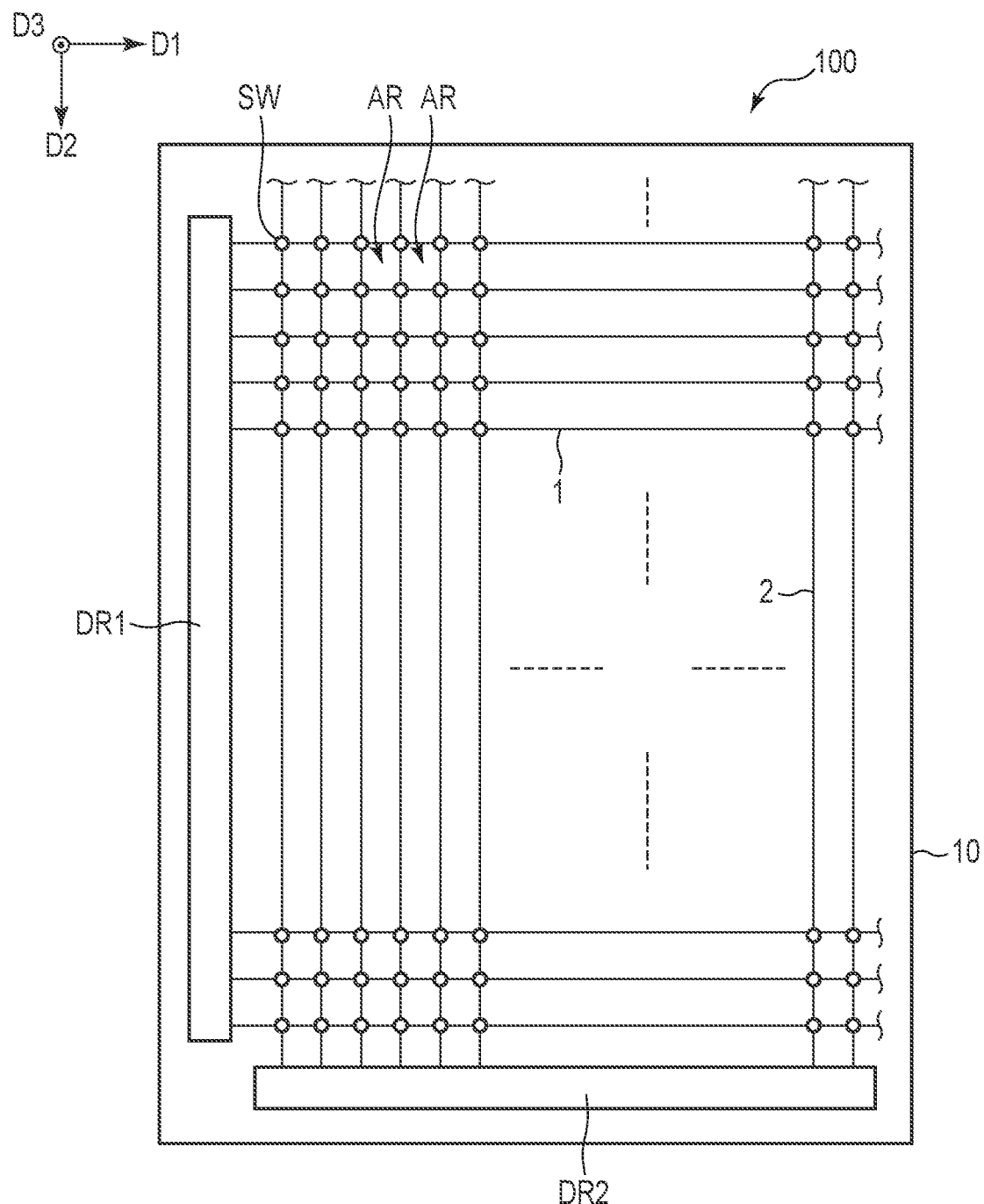
FIG. 1 is a schematic plan view of a pressure sensor according to an embodiment.

In general, according to one embodiment, a pressure sensor comprises an insulating base material, an switching element disposed on the insulating base material, a piezoelectric layer disposed on the insulating base material and the switching element and an underlying layer located between the piezoelectric layer and the insulating base material, and the modulus of elasticity of the underlying layer is greater than the modulus of elasticity of the piezoelectric layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

Now, the first embodiment will be described.

FIG. 1 is a schematic plan view of the pressure sensor 100 of the present embodiment.

In the present embodiments, a first direction D1, a second direction D2 and a third direction D3 are defined as shown in the figures. The first direction D1 and the second direction D2 correspond to directions parallel to a main surface of a pressure sensor 100 and intersect each other. The third direction D3 is a direction perpendicular to the first direction D1 and the second direction D3 and corresponds to a thickness direction of the pressure sensor 100. In the present embodiments, the first direction D1 and the second direction D2 are orthogonal to each other, but may intersect at an angle other than right angles. In the following descriptions, a direction forwarding a tip of an arrow indicating the third direction D3 is referred to as "upward" and a direction forwarding oppositely from the tip of the arrow is referred to as "downward". Assuming an observation position where the pressure sensor 100 is observed is at a tip side of the arrow indicating the third direction D3, a view from the observation position towards a plane D1-D2 defined by the first direction D1 and the second direction D2 is referred to as plan view.

The pressure sensor 100 comprises a plurality of scanning lines 1, a plurality of signal lines 2, a plurality of switching elements SW, an insulating base material 10, a scanning line driver DR1 and a signal line driver DR2. The scanning lines 1, the signal lines 2, the switching elements SW, the scanning line driver DR1 and the signal line driver DR2 are disposed on the insulating base material 10. The scanning lines 1 each extend along the first direction D1 and are arranged along the second direction D2. The scanning lines 1 are each connected to the scanning line driver DR1. The signal lines 2 each extend along the second direction D2 and are arranged along the first direction D1. The signal lines 2 are each connected to the signal line driver DR2. The switching elements SW are each located at an intersection between a respective scanning line 1 and a respective signal line 2 and are electrically connected to the scanning line 1 and the signal line 2. Note that the details of the configuration of the switching elements SW will be described later.

In this embodiment, an area surrounded by two adjacent scanning lines 1 and two adjacent signal lines 2 is defined as a unit area AR. The unit areas AR are arranged in a matrix along the first direction D1 and the second direction D2.

Figure 2:
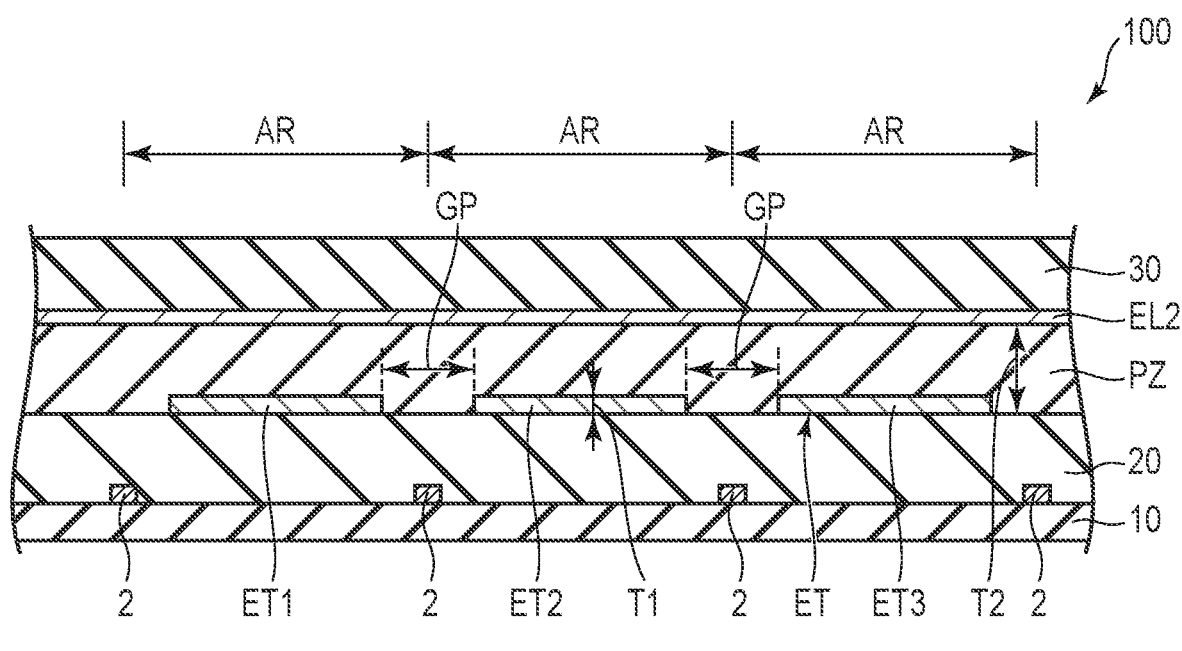
FIG. 2 is a schematic cross-sectional view of a part of the pressure sensor.
Figure 2:
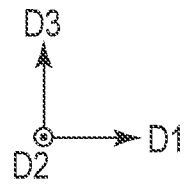

FIG. 2 is a schematic cross-sectional view of a part of the pressure sensor 100.

The pressure sensor 100 comprises an insulating base material 10, a component layer 20 containing the signal lines 2, the switching elements SW, etc., an underlying layer ET, an organic piezoelectric layer PZ, a second electrode EL2, and an sealing layer 30.

The insulating base material 10 has flexibility and is formed, for example, of polyimide. The component layer 20 is located on the insulating base material 10 and includes the signal lines 2, the switching elements SW, inorganic insulating films, organic insulating films and the like.

The underlying layer ET is located between the organic piezoelectric layer PZ and the insulating base material 10. The elastic modulus of the underlying layer ET is greater than that of the organic piezoelectric layer PZ. The underlying layer ET may be, for example, the first electrode EL1, which will be described below, an inorganic insulating film, or a metal film. The underlying layer ET has a thickness T1. The organic piezoelectric layer PZ has a thickness T2. The thickness T1 is less than or equal to the thickness T2. For example, the thickness T2 is 3 to 5 µm. In the example illustrated, the underlying layer ET includes island-shaped first portion ET1, second portion ET2 and third portion ET3. The first, second, and third portions are separated from each other with gaps GP formed therebetween. Since the underlying layer ET is formed into an island shape, the area occupied by the underlying layer ET is less than the area occupied by the organic piezoelectric layer PZ in plan view.

Note that a portion of the underlayment ET is disposed in one unit area AR, but the embodiment is not limited to this example. For example, one underlying ET may be disposed over a plurality of unit areas AR.

The organic piezoelectric layer PZ overlaps the first portion ET1, the second portion ET2, the third portion ET3, the gap GP between the first portion ET1 and the second portion ET2, and the gap GP between the second portion ET2 and the third portion ET3. The organic piezoelectric layer PZ is formed of an organic piezoelectric material and has elasticity. For example, the organic piezoelectric layer PZ is formed by using polyvinylidene fluoride (PVDF). After the application of the material, which is cured, for example, by heat, thus obtaining the organic piezoelectric layer PZ. The organic piezoelectric layer PZ generates voltage when pressure is applied thereto, and the voltage is read by the respective switching element SW or the like. Thus, with the formation of the organic piezoelectric layer PZ, the function of detecting the pressure can be added to the pressure sensor 100.

Further, the organic piezoelectric layer PZ is formed over the substantially entire surface of the pressure sensor 100. With this configuration, it is possible to impart the function of detecting the pressure to the entire surface of the pressure sensor 100. The insulating base material 10 is made of a flexible material, and therefore it is possible to form a pressure sensor 100 which can sense the pressure in a curved state. Further, the organic piezoelectric layer PZ has characteristics that the material thereof degrades during patterning and is vulnerable to heat, and therefore it is difficult to pattern. However, in this embodiment, the organic piezoelectric layer PZ is applied to the entire surface of the pressure sensor 100, and therefore the patterning of the organic piezoelectric layer PZ is not required. Therefore, the processing step for the patterning is not increased, and therefore the pressure sensor 100 can be formed at low cost.

The second electrode EL2 is located on the organic piezoelectric layer PZ. The sealing layer 30 is located above the second electrode EL2 and the organic piezoelectric layer PZ. That is, in the example illustrated, the second electrode EL2 is located between the organic piezoelectric layer PZ and the sealing layer 30. The sealing layer 30 is formed of a poly-p-xylylene (poly-para-xylylenes: PPX) structure, for example, Parylene (registered trademark).

Figure 3:
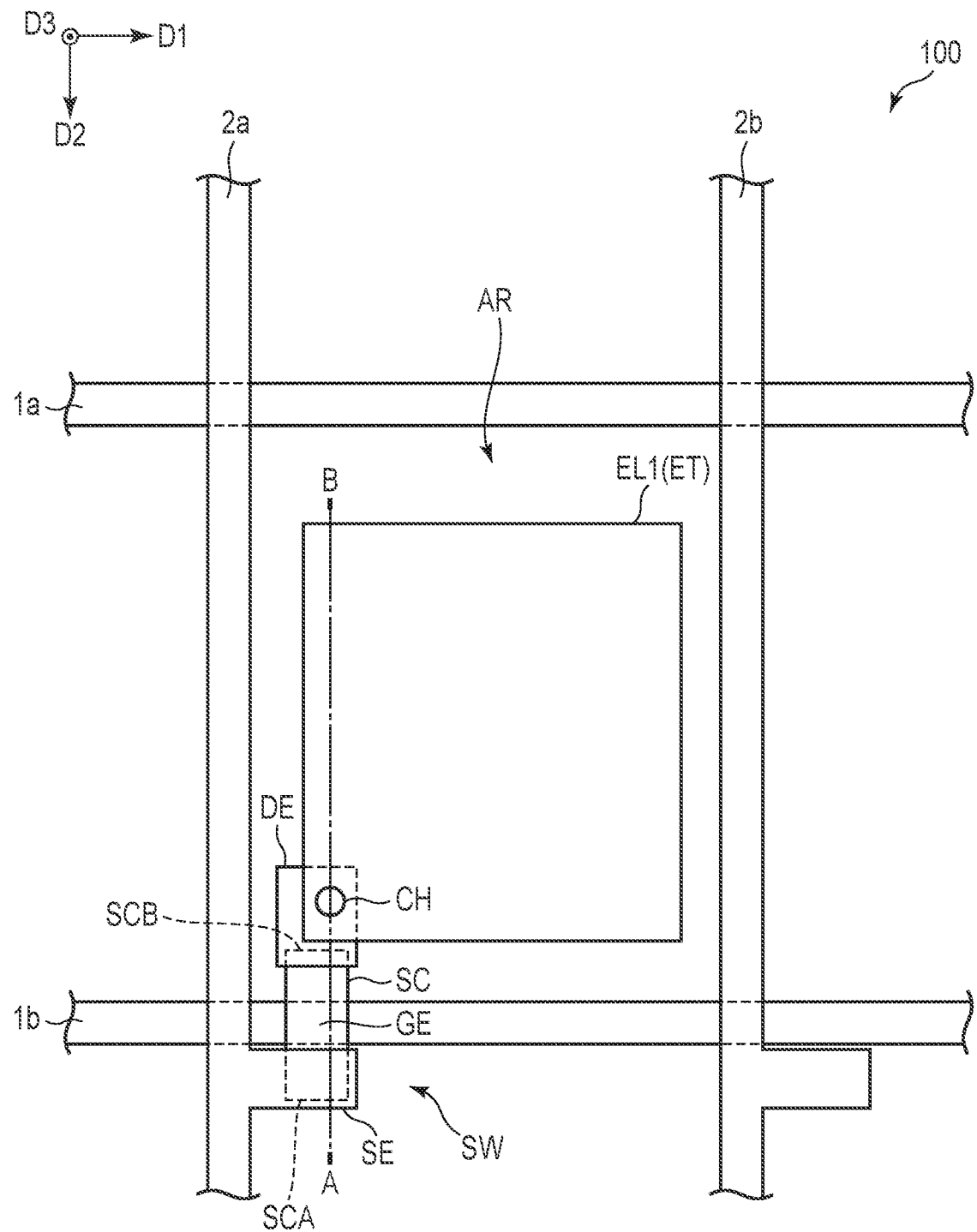
FIG. 3 is a plan view of a unit area of the pressure sensor shown in FIG. 2.

FIG. 3 is a plan view showing the unit area AR of the pressure sensor 100 shown in FIG. 2. FIG. 3 shows the case where the first electrode EL1 corresponds to the underlying layer ET.

The scanning lines 1a and 1b each extend along the first direction D1 and are arranged along the second direction D2. The signal lines 2a and 2b each extend along the second direction D2 and are arranged along the first direction D1. In the example illustrated, the unit area AR is defined by the scanning lines 1a and 1b and the signal lines 2a and 2b.

The switching element SW comprises a source electrode SE, a drain electrode DE, a semiconductor layer SC and a gate electrode GE.

The source electrode SE protrudes from the signal line 2a in the first direction D1. The drain electrode DE is formed of the same material as that of the signal lines 2a and 2b, and is formed into an island shape. The drain electrode DE is placed between the signal line 2a and the signal line 2b. Note that in the switching element SW, the drain electrode DE may be referred to as the source electrode.

The semiconductor layer SC is disposed so that a part thereof overlaps the source electrode SE, and the other parts extend inward in the unit area AR. The semiconductor layer SC intersects the scanning line 1b. In the scanning line 1b, the area overlapping the semiconductor layer SC functions as the gate electrode GE. The semiconductor layer SC is electrically connected to the source electrode SE by one end portion SCA thereof and to the drain electrode DE by the other end SCB.

The first electrode EL1 is located on an inner side enclosed by the scanning lines 1A and 1B and the signal lines 2A and 2B. The first electrode EL1 is connected to the drain electrode DE via a contact hole CH. In the example illustrated, the first electrode EL1 corresponds to the underlying layer ET, and therefore one underlying layer ET is arranged per unit area AR.

Figure 4:
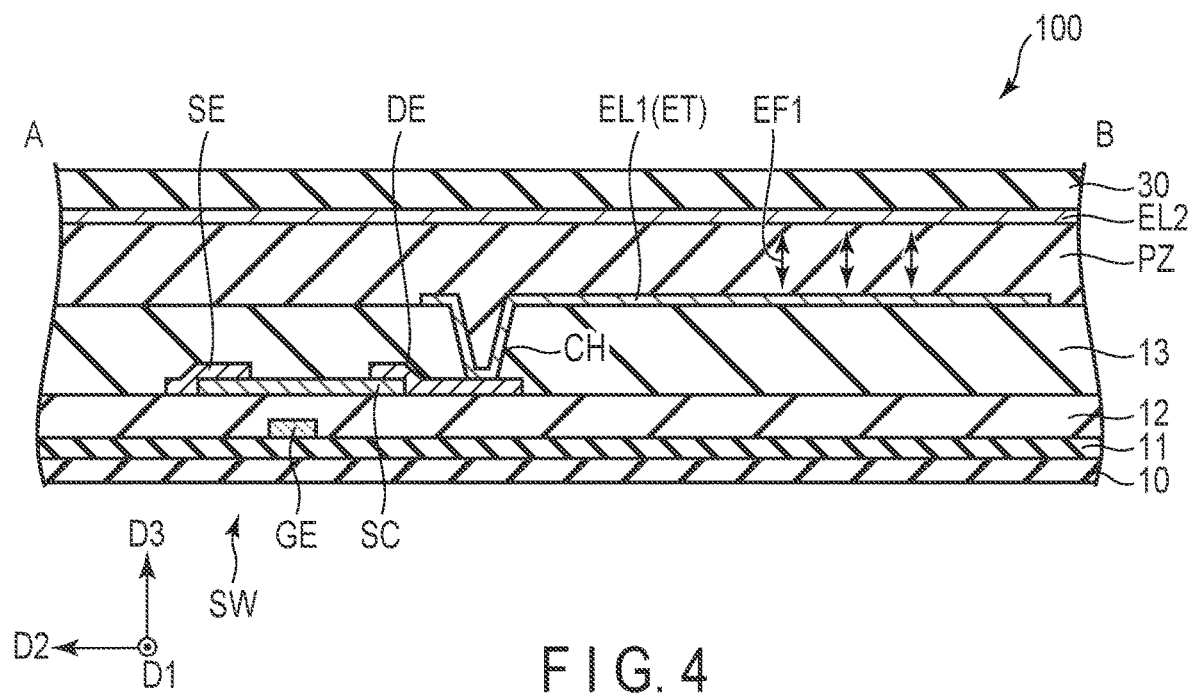
FIG. 4 is a schematic cross-sectional view of a part of the pressure sensor, taken along A-B in FIG. 3.

FIG. 4 is a schematic cross-sectional view of a part of the pressure sensor 100, taken along A-B in FIG. 3.

An insulating film 11 is provided to cover the insulating base material 10. The gate electrode GE is located on the insulating film 11. An insulating film 12 is provided to cover the gate electrode GE and the insulating film 11. The semiconductor layer SC is located on the insulating film 12. The source electrode SE and the drain electrode DE are located above the insulating film 12 and are in contact with the semiconductor layer SC. An insulating film 13 is provided to cover the source electrode SE, the drain electrode DE, the semiconductor layer SC, and the insulating film 12.

The insulating films 11 and 12 are both formed of an inorganic insulating material such as silicon oxide (SiO), silicon nitride (SiN) or silicon oxynitride (SiON). The insulating films 11 and 12 may each be of a single-layered or multilayered structure. The insulating film 13 is formed of an organic insulating material.

The first electrode EL1 is located above the insulating film 13. The first electrode EL1 is connected to the switching element SW via a contact hole CH formed in the insulating film 13. The organic piezoelectric layer PZ covers the insulating film 13 and the first electrode EL1. The organic piezoelectric layer PZ is placed above the insulating base material 10 and the switching element SW. The second electrode EL2 opposes the first electrode EL1 via the organic piezoelectric layer PZ. The second electrode EL2 is located above the first electrode EL1. In other words, the second electrode EL2 is located on a sealing layer 30 side with respect to the first electrode EL1. In the example illustrated, a lower surface of the second electrode EL2 is in contact with the organic piezoelectric layer PZ, but the lower surface of the second electrode EL2 may be covered by an insulating film. Further, in the example illustrated, an upper surface of the first electrode EL1 is in contact with the organic piezoelectric layer PZ, but the upper surface of the first electrode EL1 may be covered by an insulating film.

In the first embodiment, when voltage is applied to the first and second electrodes EL1 and EL2, a longitudinal electric field EF1 along the third direction D3 is generated. By applying the electric field to the organic piezoelectric layer PZ, the organic piezoelectric layer PZ can be subjected to polarization treatment (poling). On to the organic piezoelectric layer PZ, a longitudinal electric field EF1 or a lateral electric field EF2 as will be described later with reference to FIG. 10 can be generated.

Figure 5:
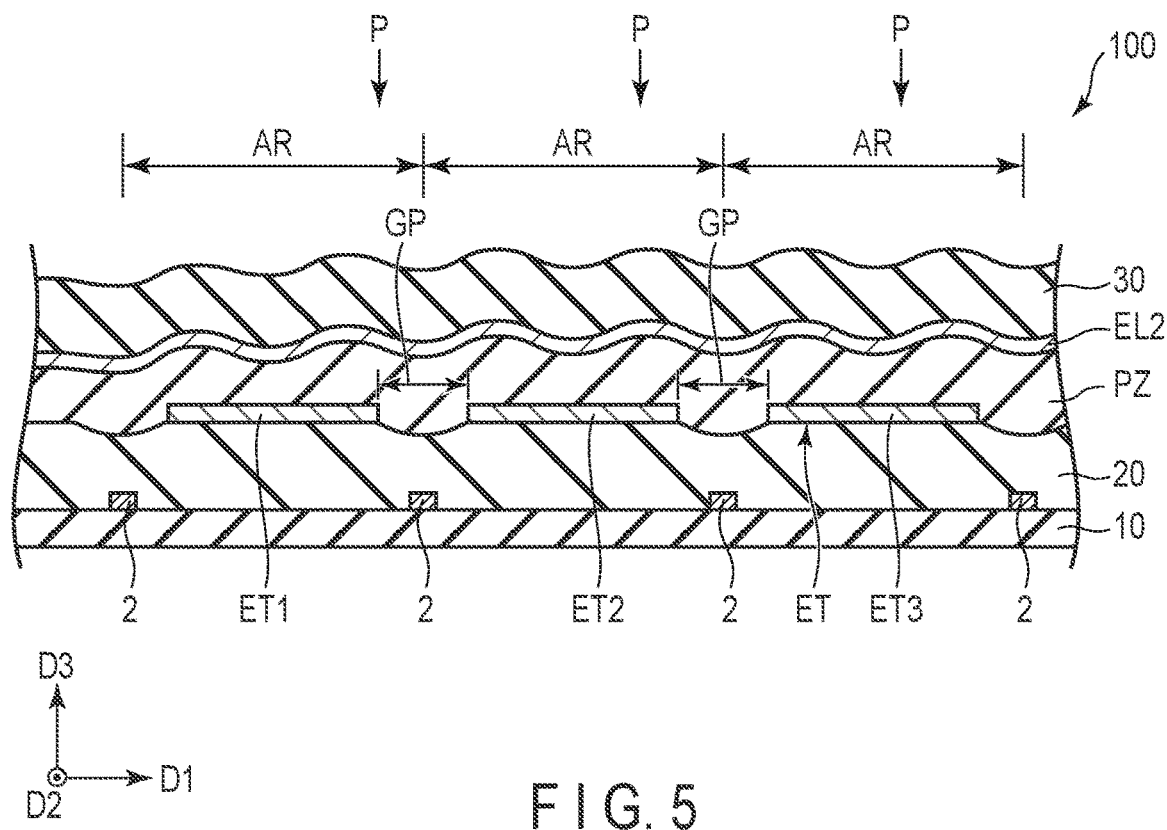
FIG. 5 is a cross-sectional view of a state of the pressure sensor shown in FIG. 2 when pressure is applied.

FIG. 5 is a cross-sectional view of a state of the pressure sensor 100 shown in FIG. 2 when a pressure P is applied thereto. It is assumed that the pressure P is applied from above the pressure sensor 100.

In a position overlapping the underlying layer ET, the organic piezoelectric layer PZ is not deformed up to a lower side from the underlying layer ET. Further, in a position overlapping the gap GP, the organic piezoelectric layer PZ is deformed up to a lower side from the underlying layer ET. In a position overlapping the gap GP, the organic piezoelectric layer PZ is deformed not only in the third direction D3, but also in the bending direction and the twisting direction with respect to the D1-D2 plane. The organic piezoelectric layer PZ can obtain a higher voltage when it deforms in the bending direction and the twisting direction with respect to the D1-D2 plane than when it deforms such that the polarization direction and the strain direction coincide with each other. Therefore, by forming the gap GP, the output voltage from the organic piezoelectric layer PZ can be improved and the sensitivity of the detection of pressure can be enhanced.

According to this embodiment, in the pressure sensor 100, the underlying layer ET is located below the organic piezoelectric layer PZ. The elastic modulus of the underlying layer ET is greater than that of the organic piezoelectric layer PZ. In this manner, the deformation of the organic piezoelectric layer PZ does not easily propagate to a lower layer side further than the underlying layer ET. Therefore, even if a flexible material is used for the insulating base material 10 to make the pressure sensor 100 flexible, the deformation of the insulating base material 10 by pressure can be suppressed. Thus, the pressure applied to the organic piezoelectric layer PZ can be suppressed from dispersing, and the amount of deformation of the organic piezoelectric layer PZ itself can be increased. In this manner, the output voltage from the organic piezoelectric layer PZ can be increased and the sensitivity of the detection of pressure can be improved.

In the example illustrated, the first electrode EL1 also serves as the underlying layer ET, but the underlying layer ET may be provided separately from the first electrode ET1. As shown in the figure, the underlying layer ET may be of an island shape or may be formed over the entire surface. It suffices if the underlying layer ET is located lower than the organic piezoelectric layer PZ, but the location is not limited to that shown in the figure. Although the second electrode EL2 is located above the organic piezoelectric layer PZ, but it may be located below the organic piezoelectric layer PZ. In that case, the electric field formed by the first and second electrodes EL1 and EL2 is a horizontal electric field.

Figure 6:
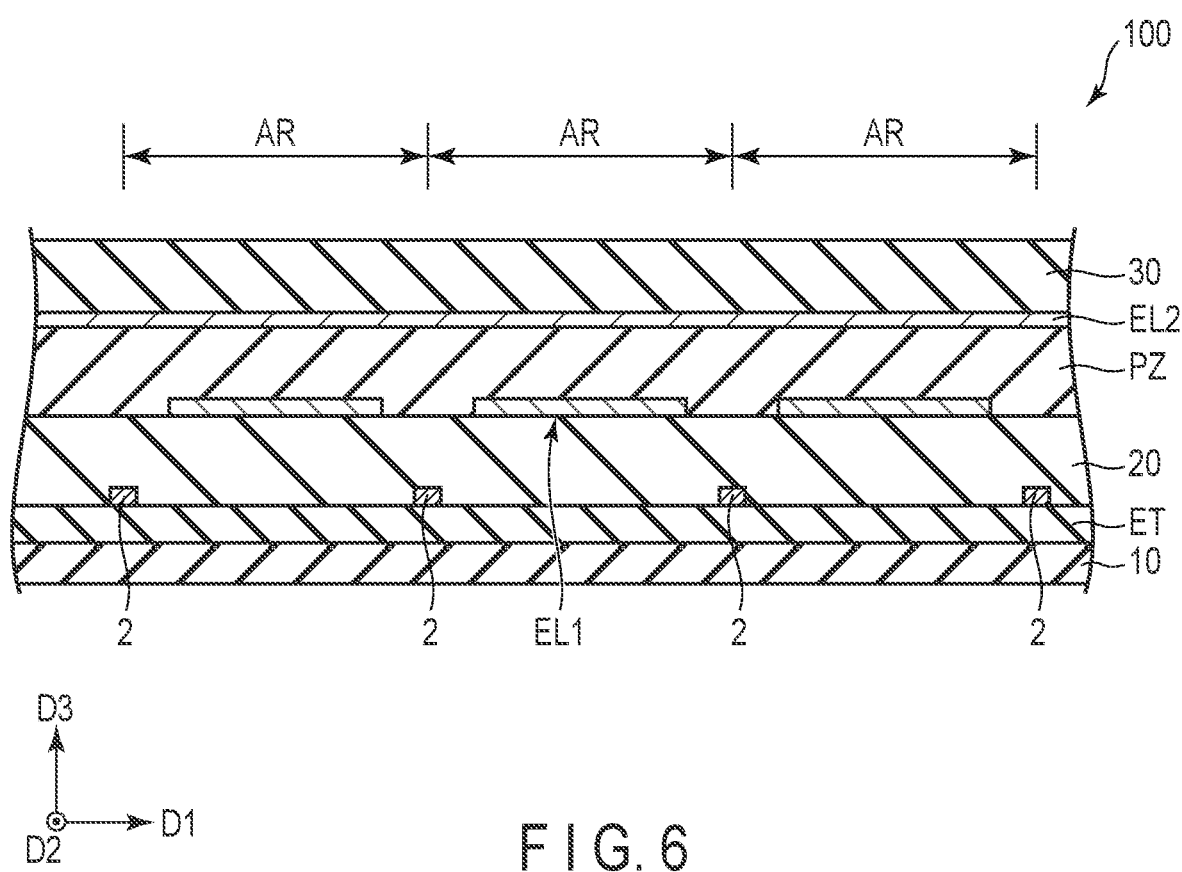
FIG. 6 is a cross-sectional view of the first modified example of the first embodiment.

FIG. 6 is a cross-sectional view showing the first modified example of the first embodiment. The configuration shown in FIG. 6 is different from that of the first embodiment in that the underlying layer ET covers the insulating base material 10.

The underlying layer ET is disposed over the substantially entire surface of the pressure sensor 100. The underlying layer ET is, for example, an inorganic insulating film. The elastic modulus of the underlying layer ET is greater than that of the insulating base material 10. With the underlying layer ET located on the insulating base material 10, the deformation of the organic piezoelectric layer PZ can be suppressed from being propagated to the insulating base material 10.

Figure 7:
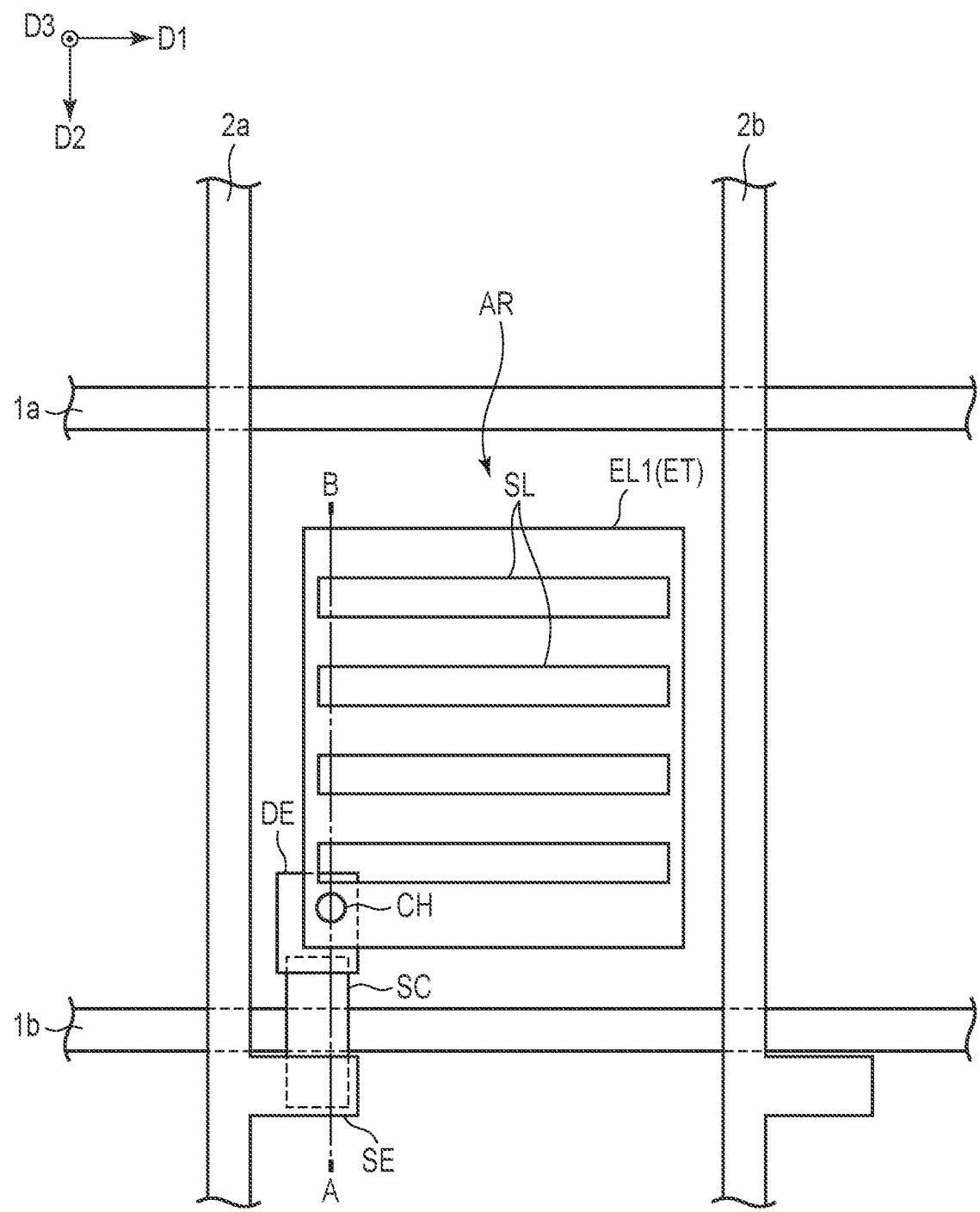
FIG. 7 is a plan view showing the second modified example of the first embodiment.
Figure 8:
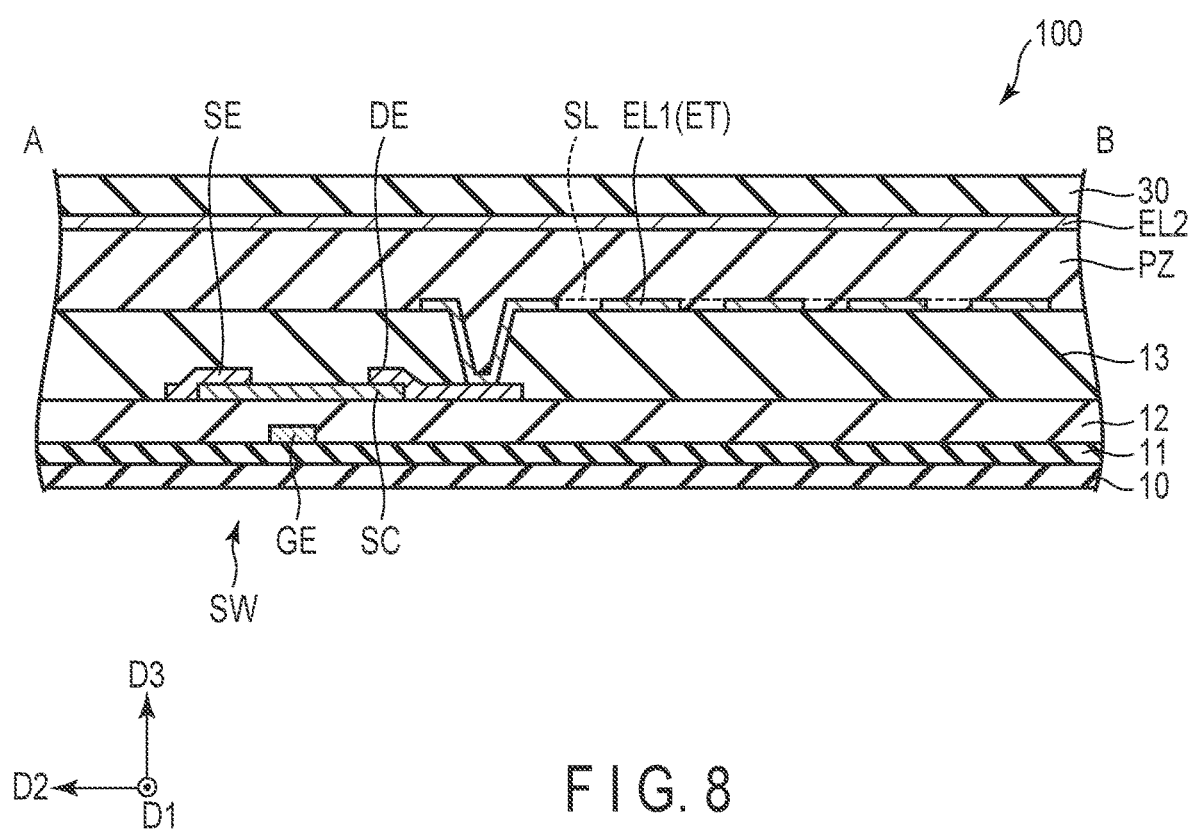
FIG. 8 is a schematic cross-sectional view of a part of the pressure sensor, taken along A-B in FIG. 7.

FIG. 7 is a plan view of the second modified example of the first embodiment. FIG. 8 is a schematic cross-sectional view of a part of the pressure sensor 100, taken along A-B in FIG. 7. The second modified example is different from the first embodiment in that the first electrode EL1 comprises a slit SL.

Here, the first electrode EL1 corresponds to the underlying layer ET, and therefore it can be rephrased that the underlying layer ET comprises the slit SL. The organic piezoelectric layer PZ can be deformed in a position where it overlaps the slit SL, by a similar manner to that in a position where it overlaps the gap GP as described above. That is, in the position overlapping the slit SL, the organic piezoelectric layer PZ deforms not only in the third direction D3, but also in the bending direction and the twisting direction with respect to the D1-D2 plane. Therefore, by forming the slit SL, the output voltage from the organic piezoelectric layer PZ can be increased and the sensitivity of the detection of pressure can be improved. The number, direction, and shape of the slits SL are not limited to those of the example illustrated.

With respect to the relationship in elastic modulus, the elastic moduli of the insulating film 13, the organic piezoelectric layer PZ and the insulating base material 10, which are organic films, are approximately equal to each other, the elastic modulus of the insulating film 12, which is an inorganic film, is greater than the elastic modulus of the above-listed organic films, and the elastic modulus of the underlying layer ET (the first electrode EL1) is greater than or equal to the elastic modulus of the insulating film 12.

Second Embodiment

Next, the second embodiment will be described. In the second embodiment, electrodes such as the first and second electrodes EL1 and EL2 are formed under the organic piezoelectric layer PZ, and thus the heat generated in the process for forming the electrodes is suppressed from being applied to the organic piezoelectric layer PZ.

Figure 9:
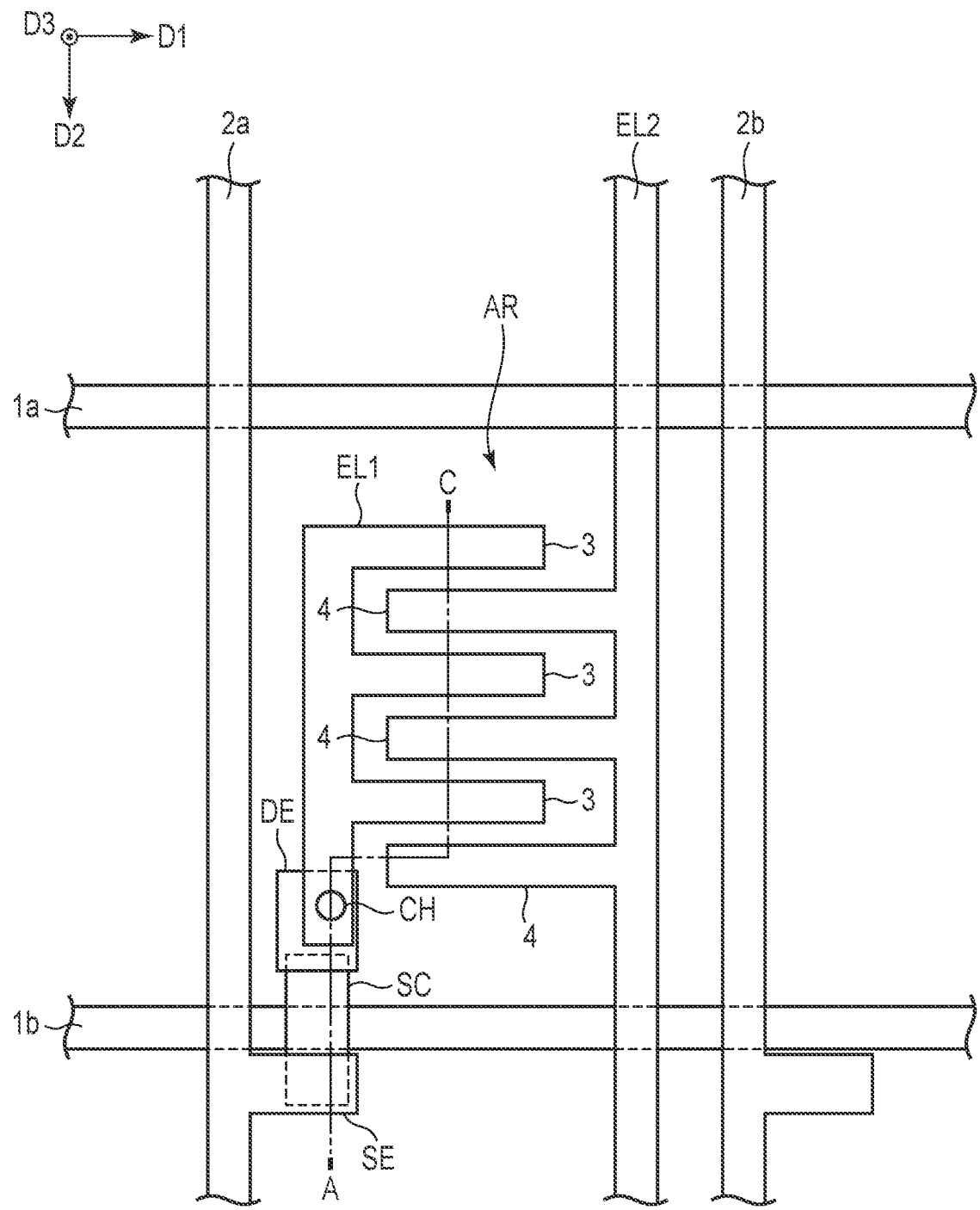
FIG. 9 is a plan view of a unit area of the pressure sensor of the second embodiment.
Figure 10:
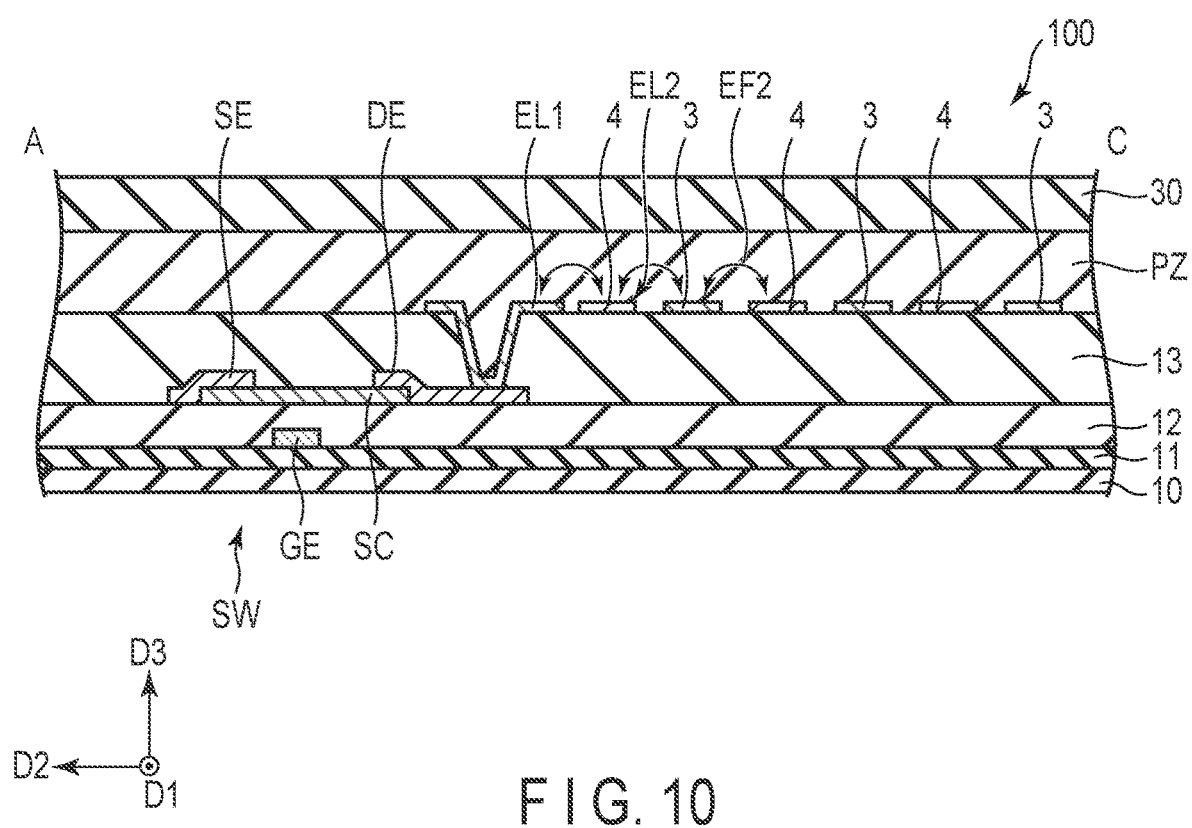
FIG. 10 is a schematic cross-sectional view of a part of the pressure sensor, taken along A-C in FIG. 9.

FIG. 9 is a plan view showing a unit area AR of the pressure sensor 100 according to the second embodiment. FIG. 10 is a schematic cross-sectional view of a part of the pressure sensor 100, taken along A-C in FIG. 9.

The first and second electrodes EL1 and EL2 are each formed into a comb teeth shape. The first electrode EL1 includes three comb tooth portions 3 extending in the first direction D1, and the second electrode EL2 includes three comb tooth portions 4 extending in the first direction D1. The comb tooth portions 3 and 4 are arranged alternately along the second direction D2. The number of comb tooth portions 3 and 4 is not limited to that of the example illustrated.

As shown in FIG. 10, the second electrode EL2 is located between the insulating base material 10 and the organic piezoelectric layer PZ. The first electrode EL1 and the second electrode E2 are located in the same layer. The second electrode EL2 opposes the first electrode EL1 along the second direction D2. Note that in the first embodiment, the insulating base material 10 is formed by polyimide, whereas in the second embodiment, the insulating base material 10 may be formed of a material having a high modulus of elasticity, such as glass. In the example illustrated, the upper surfaces of the first and second electrodes EL1 and EL2 are in contact with the organic piezoelectric layer PZ, but the upper surfaces of the first and second electrodes EL1 and EL2 may be covered by an insulating film.

For example, when a longitudinal electric field EF1 as shown in the first embodiment is generated in the organic piezoelectric layer PZ, electrodes are formed on top and bottom of the organic piezoelectric layer PZ so as to sandwich the layer. That is, after the process of forming the organic piezoelectric layer PZ, it is necessary to carry out the process of forming the second electrode EL2. When an organic piezoelectric material with low heat resistance such as PVDF is used, a high-temperature process cannot be carried out after the formation of the organic piezoelectric layer PZ. Therefore, the second electrode EL2 is formed by coating or printing of silver ink or PEDOT, which may increase the process load. Apart from this, in such a method of attaching electrodes formed on glass or the like from above, there may arise such a problem that the air bubbles enter.

According to the second embodiment, the first electrode EL1 and the second electrode EL2 are both formed under the organic piezoelectric layer PZ. In the second embodiment, when voltage is applied to the first electrode EL1 and the second electrode EL2, a lateral electric field EF2 along the plane direction of the pressure sensor 100 is generated. By using the pressure sensor 100 as a lateral electric field drive, the electrodes above the organic piezoelectric layer PZ become unnecessary, and the process load can be reduced.

Note that the second embodiment can be combined with the first embodiment. In other words, the first and second electrodes EL1 and EL2 can be used as the underlying layer ET. Alternatively, a separate underlying layer ET may be provided.

Figure 11:
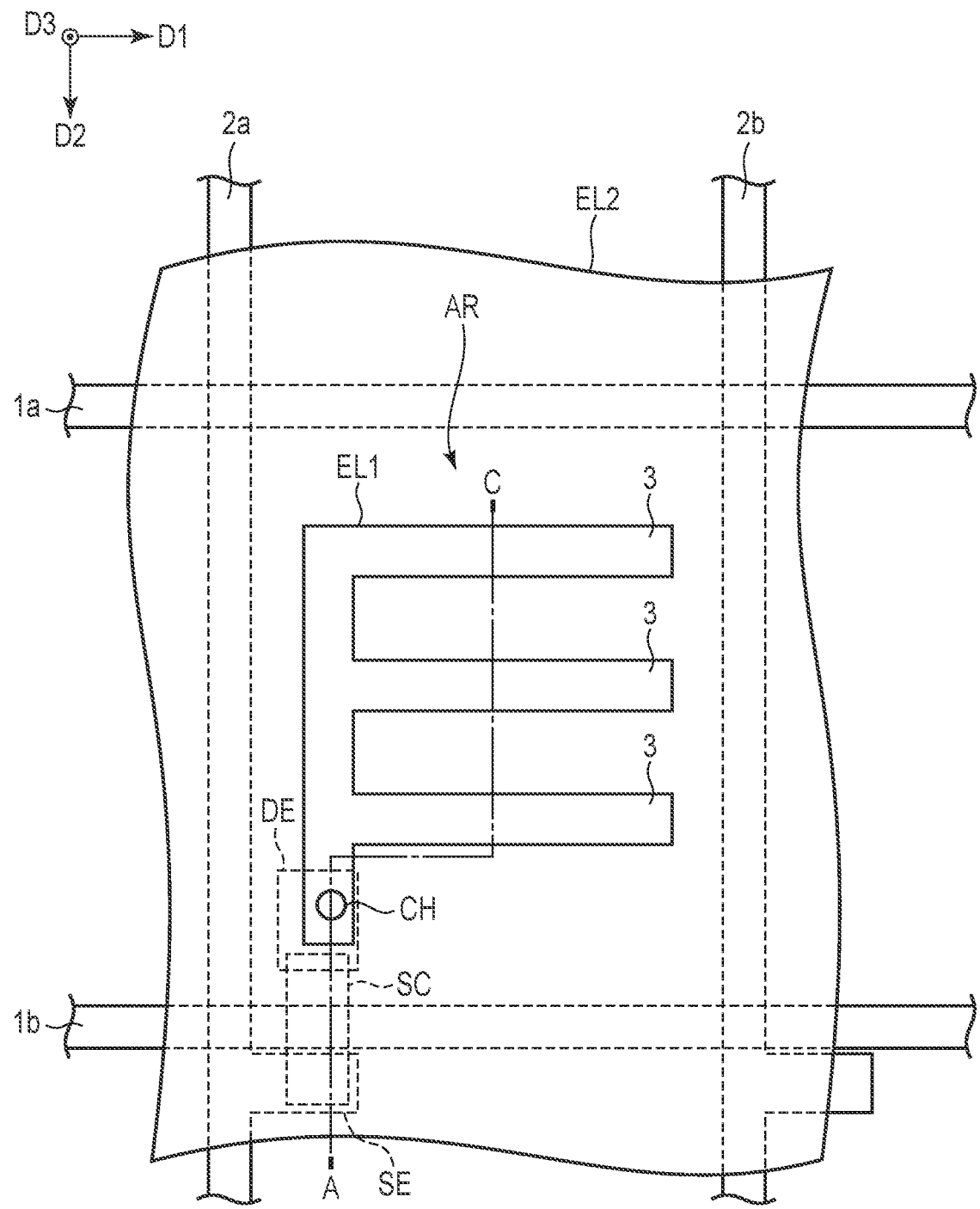
FIG. 11 is a plan view showing a modified example of the second embodiment.

FIG. 11 is a plan view of a modified example of the second embodiment. FIG. 12 is a schematic cross-sectional view of a part of the pressure sensor 100, taken along A-C in FIG. 11. In the modified example, the shape of the second electrode EL2 is different as compared to the second embodiment.

The first electrode EL1 is formed into a comb tooth shape. The first electrode EL1 includes three comb teeth portions 3 extending in the first direction D1. The number of comb teeth portions 3 is not limited to that of the example illustrated. The second electrode EL2 is arranged over the entire area of the unit area AR.

As shown in FIG. 12, the second electrode EL2 is located on the insulating film 13. An insulating film 14 is provided to cover the insulating film 13 and the second electrode EL2. The first electrode EL1 is located on the insulating film 14. The first electrode EL1 and the second electrode EL2 oppose each other along the third direction D3 via the insulating film 14. In this modified example, the first and second electrodes EL1 and EL2 can be formed below the organic piezoelectric layer PZ as in the case of the second embodiment. In the modified example, when voltage is applied to the first and second electrodes EL1 and EL2, a lateral electric field EF2 along the surface direction of the pressure sensor 100 is generated. In the example illustrated, the upper surface of the first electrode EL1 is in contact with the organic piezoelectric layer PZ, but the upper surface of the first electrode EL1 may be covered by an insulating film.

As explained above, according to the present embodiments, a pressure sensor using an organic piezoelectric material can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pressure sensor comprising:
   an insulating base material;
   a switching element disposed on the insulating base material;
   a piezoelectric layer disposed on the insulating base material and the switching element; and
   an underlying layer located between the piezoelectric layer and the insulating base material,
   wherein a modulus of elasticity of the underlying layer is greater than a modulus of elasticity of the piezoelectric layer.

2. The pressure sensor of claim 1, wherein the underlying layer is a first electrode connected to the switching element.

3. The pressure sensor of claim 1, wherein the underlying layer comprises a slit.

4. The pressure sensor of claim 1, wherein the underlying layer is an inorganic insulating film.

5. The pressure sensor of claim 1, wherein the underlying layer comprises an island-shaped first portion and an island-shaped second portion, and the piezoelectric layer overlaps the first portion, the second portion, and a gap between the first portion and the second portion.

6. The pressure sensor of claim 1, wherein a thickness of the underlying layer is less than or equal to a thickness of the piezoelectric layer.

7. The pressure sensor of claim 2, further comprising: a second electrode opposing the first electrode, wherein
the second electrode is located between the insulating base material and the piezoelectric layer.

8. The pressure sensor of claim 7, wherein the first electrode and the second electrode are located in a same layer.

9. The pressure sensor of claim 7, wherein the first and second electrodes oppose each other via an insulating film.

* * * * *